United States Patent
Ilan et al.

(10) Patent No.: US 6,629,256 B1
(45) Date of Patent: Sep. 30, 2003

(54) APPARATUS FOR AND METHOD OF GENERATING A CLOCK FROM AN AVAILABLE CLOCK OF ARBITRARY FREQUENCY

(75) Inventors: Havin Ilan, Rosh Haayin (IL); Onn Haran, Kfar-Saba (IL); Eric Baissus, LeRouret (FR)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/542,297

(22) Filed: Apr. 4, 2000

(51) Int. Cl.[7] .................................................. G06F 1/04
(52) U.S. Cl. ........................ 713/501; 713/500; 713/501; 713/503
(58) Field of Search .......................................... 713/501

(56) References Cited

U.S. PATENT DOCUMENTS

| | | | |
|---|---|---|---|
| 3,928,813 A | * 12/1975 | Kingsford-Smith | ......... 331/1 A |
| 3,976,945 A | * 8/1976 | Cox | ............................ 327/107 |
| 4,939,389 A | 7/1990 | Cox et al. | |
| 5,267,273 A | * 11/1993 | Dartois et al. | .............. 375/355 |
| 5,517,521 A | * 5/1996 | Strawn | ....................... 375/219 |
| 5,594,365 A | 1/1997 | Agrawal et al. | |
| 5,805,608 A | 9/1998 | Baeg et al. | |
| 5,887,244 A | 3/1999 | Aldridge et al. | |
| 5,943,613 A | 8/1999 | Wendelrup et al. | |
| 5,987,339 A | 11/1999 | Asano | |
| 6,157,232 A | * 12/2000 | Hossner et al. | .............. 327/159 |
| 6,157,376 A | * 12/2000 | Eglit | ........................... 345/213 |
| 6,167,097 A | * 12/2000 | Marston et al. | ............. 375/316 |
| 6,208,180 B1 | * 3/2001 | Fisch et al. | .................. 327/141 |
| 6,289,067 B1 | * 9/2001 | Nguyen et al. | ............. 375/372 |

FOREIGN PATENT DOCUMENTS

| | | |
|---|---|---|
| EP | 1 052 779 A1 | 11/2000 |
| GB | 2 297 884 A | 8/1996 |
| WO | PCT WO 00/10354 | 2/2000 |

OTHER PUBLICATIONS

IBM TDB vol. 29, Issue 8, pp. 3433–3437.*

* cited by examiner

Primary Examiner—Thomas Lee
Assistant Examiner—Nitin Patel
(74) Attorney, Agent, or Firm—Ronald O. Neerings; Wade J. Brady, III; Frederick J. Telecky, Jr.

(57) ABSTRACT

An apparatus for and method of generating a clock signal having a desired frequency that is derived from a clock source having any arbitrary, frequency. The mechanism of the present invention generates an average rate, very close to the optimal rate desired, by 'swallowing' or absorbing clock cycles of the available frequency source. Precise timing is achieved by adding correcting time intervals, which are based on counting pulses from the higher rate clock source. The clock frequency generator comprises a standby mode state machine and a jitter calculation processor. Timing calculations are performed by the jitter calculation processor and the standby mode state machine functions to generate the desired standby mode clock frequency. The state machine utilizes counters to track the number of cycles of the available clock and the number of generated cycles of the standby clock.

33 Claims, 4 Drawing Sheets

APPARATUS FOR AND METHOD OF GENERATING A CLOCK FROM AN AVAILABLE CLOCK OF ARBITRARY FREQUENCY

FIELD OF THE INVENTION

The present invention relates generally to clock generator circuits and more particularly relates to an apparatus for and method of generating an accurate clock from an available clock source having an arbitrary frequency.

BACKGROUND OF THE INVENTION

Many communication systems such as portable or mobile systems operate in one of two modes: an active or normal operating mode and a reduced power standby mode. The active mode is used for normal operation of the device while standby mode is used when one or more portions of the device are not needed. For example, in a cellular telephone, when a call is received and a conversation is taking place, the phone is in normal active mode. During idle period, however, when the phone is not in use most of the circuitry can be placed in standby mode which typically uses far less power than active mode.

While in standby mode (or sleep mode as it is commonly referred to), the device may 'wake up' periodically to maintain synchronization with the base station or other central device either via an interrupt mechanism, an internal state machine, or other means. Thus, during standby times, the phone may temporarily not communicate with the network but it still maintains synchronization with it. In such a mode, the power consumption of the device is greatly reduced, which is especially crucial in devices that are battery powered.

Figure 1:
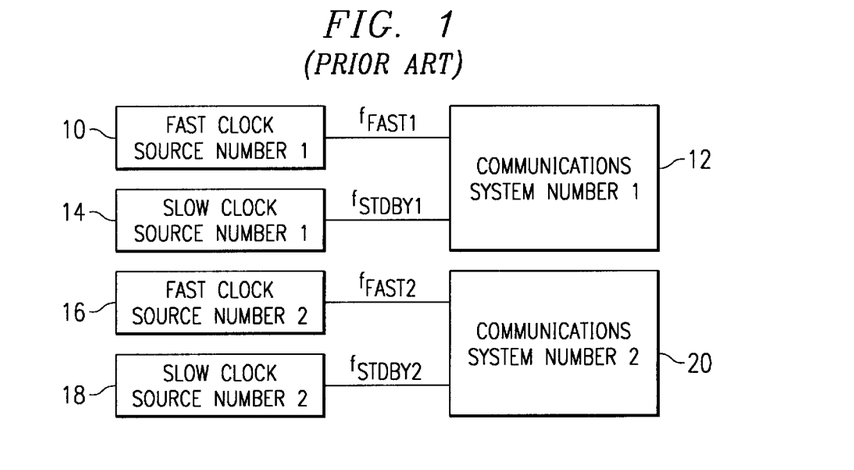
FIG. 1 is a block diagram illustrating a prior art device comprising two communication systems wherein each individual communication system has its own fast clock and standby clock sources.

The use of dual modes of operation, i.e., normal active mode and low power standby mode typically requires the use of two different clock frequency sources. A block diagram illustrating a prior art device comprising two communication systems wherein each individual communication system has its own fast clock and standby clock sources is shown in FIG. 1. Communication system #1 12 operates in either active mode or standby mode. Each mode requires a different clock frequency. A fast clock source #1 10 is used to generate a fast clock having a frequency $f_{FAST1}$ while a second slow clock source #1 14 is used to generate a standby clock (i.e., slow clock) having a frequency $f_{STDBY1}$. Similarly, communication system #2 20 operates in either active mode or standby mode. Each mode requires a different clock frequency. A fast clock source #2 16 is used to generate a fast clock having a frequency $f_{FAST2}$ while a second slow clock source #2 18 is used to generate a standby clock (i.e., slow clock) having a frequency $f_{STDBY2}$.

In both systems, a faster frequency source is used when the device is active (with increased current consumption) and a slower frequency source is used when the device is in standby. The slow frequency source, however, must be chosen such that the proper timing corresponding to network time instances (i.e., events or occurrences) can be derived from it.

A problem arises when a communications module is to be added onto an existing one, as shown in the example whereby communication system #2 is added onto already existing communication systems #1. A slower frequency source (i.e., clock source #1 14) already exists which is appropriate for deriving the clock timing needed for standby mode. When communications system #2 is added, a second slow clock source is required since the already existing slow clock source #1 is likely not appropriate and would lead to incorrect turn-on times (i.e., either too early or too late) when returning from sleep or standby mode to active mode in communication system #2. Turn on times that are too early result in increased power consumption and consequently shorter battery life. Turn on times that are too late may cause the system to lose synchronization with the network.

SUMMARY OF THE INVENTION

The present invention is an apparatus for and method of generating a clock signal having a desired frequency that is derived from a clock source having any arbitrary frequency. When utilized to supply the slow clock for the standby mode of operation of a device, the mechanism described herein enables the use of an arbitrarily low frequency source while providing accurate timing. This results in reduced power consumption that would otherwise be wasted during unnecessary time spent in the active mode of operation. The mechanism of the present invention generates an average rate, very close to the optimal rate desired, by 'swallowing' or absorbing clock cycles of the available frequency source. In addition, precise timing is achieved by adding correcting time intervals, which are based on counting pulses from the higher rate clock source.

A clock frequency generator functions to generate the standby clock from the available frequency source. The clock frequency generator comprises a standby mode state machine and a jitter calculation processor. Timing calculations are performed by the jitter calculation processor and the standby mode state machine functions to generate the desired standby mode clock frequency. The state machine utilizes counters to track the number of cycles of the available clock and the number of generated cycles of the standby clock. The processor is aware of the state of the counters in the state machine that is typically implemented in hardware.

The jitter calculation processor determines the accumulated jitter error (i.e., the interval of time to be compensated) in accordance with (1) the accumulated timing error due to the difference in frequencies between the available and desired clock frequencies and (2) the number of clock cycles absorbed or swallowed. This interval is measured using the fast clock rate which is to be activated at the proper time when switching back to active mode from standby mode. Only when the last portion of the interval is measured, can the device be permitted to re-enter the active mode by powering the active mode circuitry in the device. This minimizes the average power consumption of the device. It is important to note that the mechanism of the present invention can utilize any available frequency source in generating the standby frequency. This permits better system integration (i.e., reduced size, lower cost, etc.) since additional frequency sources are not required.

The application of the clock generator apparatus and method of the present invention to communication systems is intended to provide the benefit of reduced costs. In particular, the invention is intended to reduce costs in devices where a second communication system (e.g., a communication systems conforming to the Bluethooth standard) is added to an already existing one (e.g., a GSM cellular telephone handset) and it is desired to any additional required power consumption to a minimum.

There is thus provided in accordance with the present invention a method of generating a first clock signal having a desired first frequency from an available second clock signal having a second frequency wherein the second frequency is higher than the first frequency, the method comprising the steps of generating the first clock signal by sequencing through a predetermined number of states whereby during each state a first plurality of cycles of the second clock are absorbed and a second plurality of cycles of the second clock are output as cycles of the first clock, correcting timing differences between the desired first frequency and the available second frequency at the end of each the sequence by adding a correcting time interval to the first clock such that the average frequency of the first clock is substantially equal to the desired first frequency and calculating a compensation interval to compensate for the accumulated timing jitter of the first clock signal during a specified time interval.

There is also provided in accordance with the present invention a method of generating a first clock signal having a desired first frequency from a second clock signal having a second frequency, the method comprising the steps of counting a first predetermined number of cycles of the second clock signal on a periodic basis, outputting a second predetermined number of cycles of the second clock signal on a periodic basis and correcting accumulated timing differences between the desired first frequency and the second frequency by counting a third predetermined number of cycles of the second clock signal and outputting a fourth predetermined number of cycles of the second clock signal such that the average frequency of the first clock is substantially equal to the desired first frequency.

There is further provided in accordance with the present invention, in a device having an active and a standby mode of operation, a method of accurately timing the period of time the device is in the standby mode, wherein the device utilizes a standby clock having a desired first frequency generated from an available clock having a second frequency while in standby mode and utilizes a fast clock having a third frequency while in the active mode, the method comprising the steps of dividing the output of the available clock into continuously repeating sequence of states, for all states but the last in the sequence: counting a first predetermined number of cycles of the available clock signal, outputting as the standby clock a second predetermined number of cycles of the available clock signal, for the last state in the sequence: correcting timing differences accumulated during the current sequence between the desired first frequency and the second frequency by counting a third predetermined number of cycles of the available clock signal and outputting as the standby clock a fourth predetermined number of cycles of the available clock signal such that the average frequency of the standby clock is substantially equal to the desired first frequency and calculating a compensation interval to compensate for the timing error of the standby clock signal accumulated while the device is in standby mode, the compensation interval derived from a jitter value determined in accordance with the total number of cycles of the available clock counted and the total number of cycles of the available clock generated during the current sequence up to the point in time the device switches to active mode.

There is also provided in accordance with the present invention an apparatus for generating a standby clock frequency in a device having an active and a standby mode of operation, wherein the device utilizes the standby clock having a desired first frequency while in standby mode and utilizes a fast clock having a second frequency while in the active mode, the apparatus comprising means for generating the standby clock from an available clock source comprising means for absorbing a first plurality of cycles of the available clock, means for outputting as the standby clock a second plurality of cycles of the available clock, adjustment means for periodically adjusting for the accumulated timing error caused by the differences in frequencies of the standby clock and the available clock such that the average frequency of the standby clock is substantially equal to the desired first frequency and means for calculating a compensation interval to compensate for the timing error of the standby clock signal accumulated during the time the device was in standby mode, the compensation interval derived from a jitter value determined in accordance with the total number of cycles of the available clock counted and the total number of cycles of the available clock generated during the current sequence up to the point in time the device switches to active mode.

There is further provided in accordance with the present invention an apparatus for generating a standby clock frequency in a device having an active and a standby mode of operation, wherein the device utilizes the standby clock having a desired first frequency while in standby mode and utilizes a fast clock having a second frequency while in the active mode, the apparatus comprising a clock frequency generator adapted to generate the standby clock from an available clock source, the clock frequency generator comprising a standby mode state machine operative to: absorb a first plurality of cycles of the available clock, output as the standby clock a second plurality of cycles of the available clock, periodically adjust for the accumulated timing error caused by the differences in frequencies of the standby clock and the available clock such that the average frequency of the standby clock is substantially equal to the desired first frequency and a jitter calculator adapted to calculate a compensation interval to compensate for the timing error of the standby clock signal accumulated during the time the device was in standby mode, the compensation interval derived from a jitter value determined in accordance with the total number of cycles of the available clock counted and the total number of cycles of the available clock generated during the current sequence up to the point in time the device switches to active mode.

BRIEF DESCRIPTION OF THE DRAWINGS

The invention is herein described, by way of example only, with reference to the accompanying drawings, wherein.

DETAILED DESCRIPTION OF THE INVENTION

General Description

Figure 2:
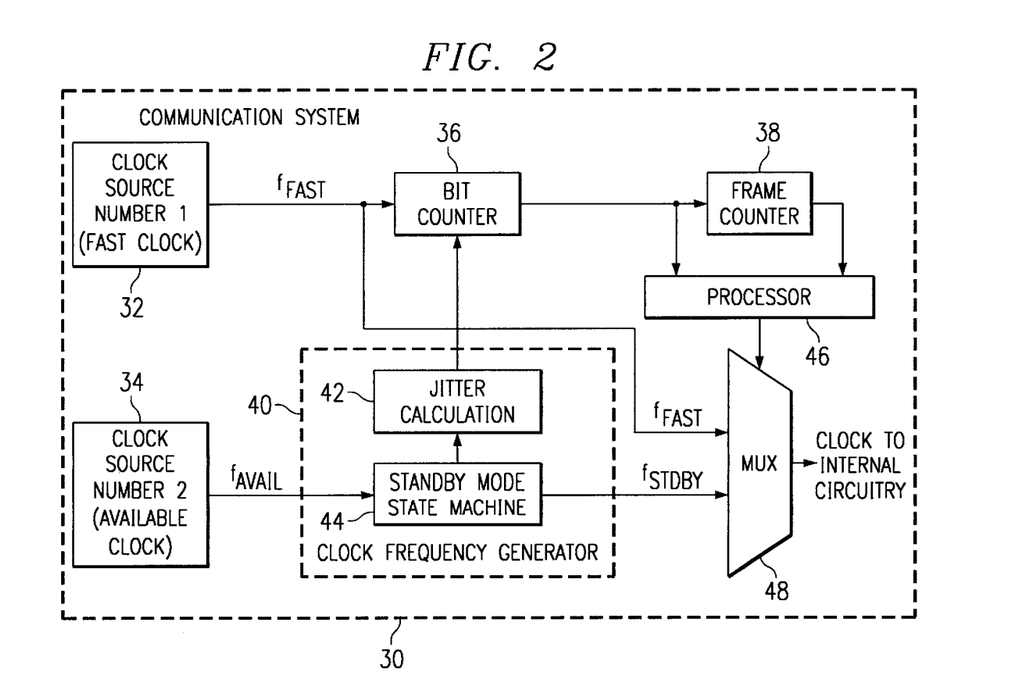
FIG. 2 is a block diagram illustrating the clock frequency generator of the present invention operative in an example communication system.

A block diagram illustrating the clock frequency generator of the present invention operative in an example communication system is shown in FIG. 2. The communication system, generally referenced 30, comprises two clock sources: clock source #1 32 which provides the frequency source $f_{FAST}$ for the fast clock and clock source #2 34 which provides the frequency source $f_{AVAIL}$ for the slow clock (i.e., standby mode clock). Note that clock source #2 comprises the available clock source and may have any arbitrary frequency. It is typically derived from a clock source having a frequency other than the desired frequency that is used elsewhere in the system.

The fast clock is input to a bit counter 36 that in turn feeds a frame counter 38. In the example communications system presented herein, the bit and frame counters are used during active mode to provide timing for bit and frame boundaries. In the typical communication system, data is sent organized as a hierarchy of data units, e.g., bits, frames, superframes, etc. The bit counter functions to define the bit number within a frame while the frame counter functions to count frames. In addition, the contents of the bit counter can be set by loading in a new count value. The output of both the bit and frame counters are input to a processor 46 that functions to control the operation of the communication system 30.

The available clock is input the clock frequency generator 40 which comprises a standby mode state machine 44 and a jitter calculation processor 42. The clock frequency generator 40 is used during standby mode to generate the standby clock having the desired standby frequency $f_{STDBY}$. The standby clock signal output of the standby mode state machine 44 and the output of the fast clock source 32 are input to a multiplexor 48. The mux select is controlled by the processor 46. The output of the mux is used by the internal circuitry of the communication system 30. When the system 30 is in active mode, the mux is configured to output the fast clock. When the system is in standby mode, the mux is configured to output the standby clock. The processor is suitably programmed to control the mux so as to maintain synchronization with the network regardless of which mode the communication system 30 is in.

Figure 3:
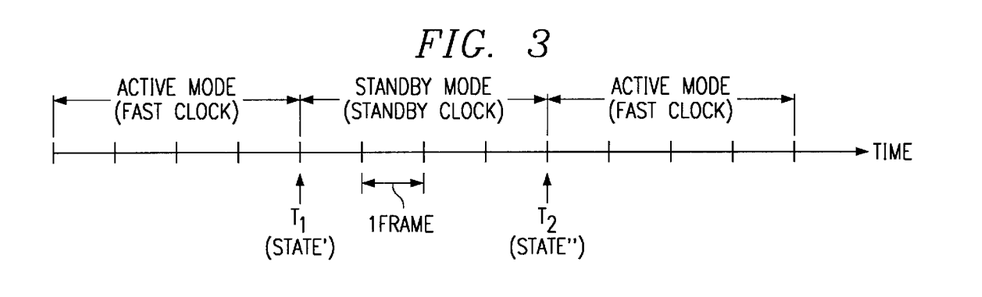
FIG. 3 is a diagram illustrating the timing of the switching between the active and standby modes.

A diagram illustrating the timing of the switching between the active and standby modes is shown in FIG. 3. Note that the ticks along the timeline indicate frames. When the system is in active mode, the fast clock is used for internal operation. At some point in time indicated $T_1$, which is typically determined in accordance with the communications protocol in use, the system receives a command or internally decides to switch from the active mode to standby mode. While in standby mode, the system uses the standby clock for internal operations and typically consumes far less power.

At some point in time indicated $T_2$, typically determined internally in accordance with the communications protocol in use, the system decides to switch back to the active mode. The system switches from the slower standby clock back to the fast active clock slightly before the device goes into the active mode. In accordance with the present invention, the state of the clock frequency generator is preserved at time $T_1$ and $T_2$, as indicated by state' and state", respectively. Note that in accordance with the communication protocol, the system only switches between active and standby modes on a frame boundary.

The standby mode state machine 44 functions to generate the standby clock having the desired frequency using the available clock (i.e., clock source #2) as the frequency source. The available clock may have any arbitrary frequency since the clock frequency generator performs the necessary conversions of clock rate while compensating for errors caused by jitter.

Figure 4:
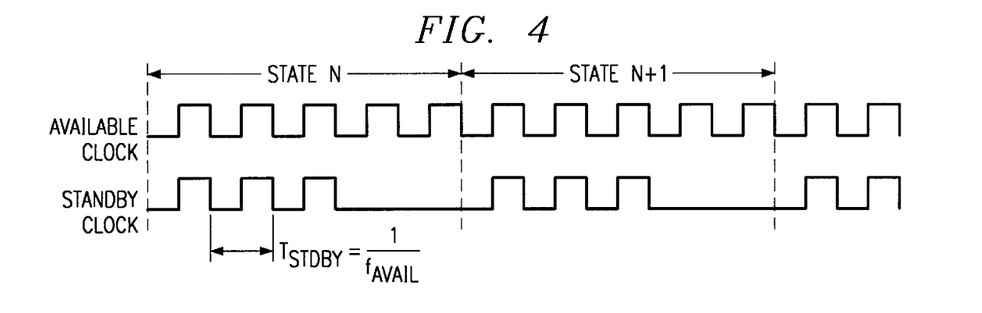
FIG. 4 is a timing diagram illustrating the standby clock generated by the clock frequency generator of the present invention utilizing an available clock having arbitrary frequency.

The standby mode state machine 44 comprises circuitry (i.e., counters, registers, etc.) to generate the standby clock. The state machine comprises a plurality of states wherein in each state, a certain number of standby clock cycles are generated on a periodic basis in accordance with the available clock. This is illustrated in FIG. 4 which shows a timing diagram illustrating the standby clock generated by the clock frequency generator of the present invention utilizing an available clock having arbitrary frequency.

The available clock is shown segmented over time into a plurality of states. States #N and #N+1 are shown to illustrate this principle. The state machine is operative to count available clock cycles while generating a particular number of standby clock cycles. Each cycle of the standby clock has a period $T_{STDBY}$ equal to $$\frac{1}{f_{AVAIL}}.$$

In order to generate a clock having an average frequency equal to the desired standby clock rate, one or more cycles of the available clock are absorbed or 'swallowed'.

Figure 5:
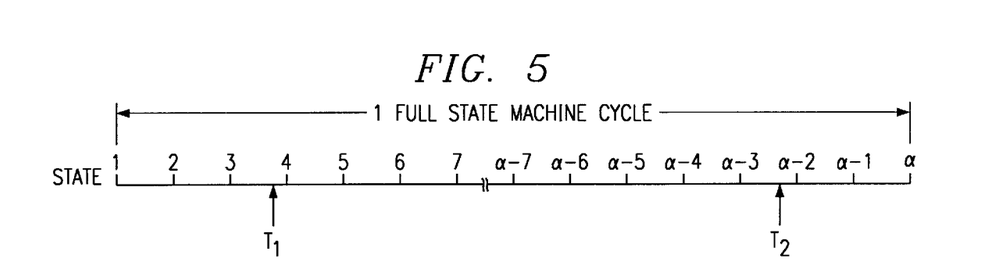
FIG. 5 is a diagram illustrating the timing of the switching between active and standby modes in relation to the timing of the standby mode state machine.

The operation of the standby mode state machine will now be described in more detail. A diagram illustrating the timing of the switching between active and standby modes in relation to the timing of the standby mode state machine is shown in FIG. 5. The timeline shown is for one complete cycle of the state machine. A full cycle is defined to have α states. The state machine is adapted to be free running and is driven by the available clock source. The state machine cycles through states #1 through #α and then returns to state #1. During states #1 through #α−1 the same number of standby clock cycles are generated. Any needed clock compensation is done in the last state #α. Thus, after α states the standby clock cycles generated, when taken together as an average, effectively generate the exact desired standby clock frequency.

At any random point in time during a full cycle, the number of standby clocks generated up to that point may not, however, combine to effectively generate the exact desired standby clock frequency. The jitter error accumulated up to that point has not yet been compensated for. As described above, compensation for jitter accumulated during states #1 through #α−1 is compensated for in the last state #α.

Note also that the switch points time $T_1$, and $T_2$, may occur at any time during the state machine cycle. In order to determine accurately the time to switch back to the active state, the jitter accumulated during the time the system was in the standby state (i.e., the time interval from $T_1$ to $T_2$) must be compensated for. Note that this time interval typically spans many cycles of the state machine but since the jitter is compensated for completely at the end of each cycle, only the jitter accumulated during the first and the last cycles need be compensated for. This corresponds to the cycles during which the two switching events occurred.

Figure 6:
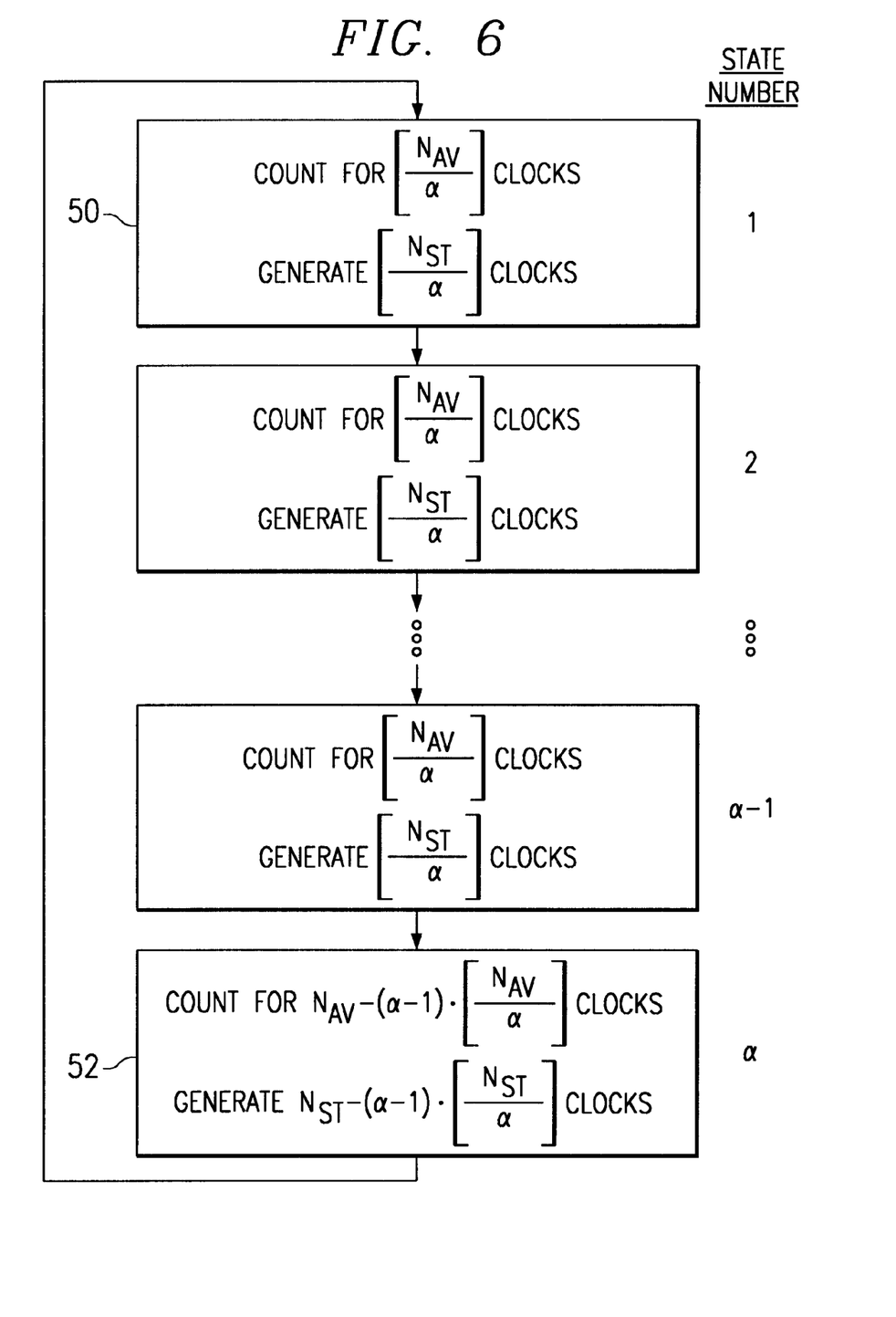
FIG. 6 is a state transition diagram of the standby mode state machine.

A state transition diagram of the standby mode state machine is shown in FIG. 6. The entity $F_{SB}$ is defined as the desired standby clock frequency and $F_{AV}$ is defined as the available clock frequency. The term GCD is defined as the greatest integer common divisor between $F_{SB}$ and $F_{AV}$. The integer values $N_{SB}$ and $N_{AV}$ are then calculated by dividing by GCD as shown below in Equations 1 and 2.

$$N_{SB} = \frac{F_{SB}}{GCD} \quad \text{and} \quad (1)$$

$$N_{AV} = \frac{F_{AV}}{GCD} \quad (2)$$

The value $N_{AV}$ represents the total number of clock cycles of the available clock in one full cycle of the state machine. Similarly, $N_{SB}$ represents the desired number of clock cycles of the standby clock in one full state machine cycle. The value $\alpha$ is defined as the rounded ratio of $N_{AV}$ to $N_{SB}$ $$\alpha = \left\lfloor \frac{N_{AV}}{N_{SB}} \right\rfloor = \left\lfloor \frac{F_{AV}}{F_{SB}} \right\rfloor \quad (3)$$

As described hereinabove, the temporary jitter produced when generating $F_{SB}$ from $F_{AV}$ is compensated for at the end of the state machine cycle. The state machine is operative to generate the standby clock so as to reduce the jitter to a minimum. The state machine is adapted to comprise $\alpha$ states. For states numbered #1 through #$\alpha$−1 (referenced 50) the machine counts $$\left\lfloor \frac{N_{AV}}{\alpha} \right\rfloor$$

clock cycles of the available clock and generates $$\left\lfloor \frac{N_{SB}}{\alpha} \right\rfloor$$

clock cycles of the standby clock. During the last state #$\alpha$ (referenced 52) the machine counts $$N_{AV} - (\alpha - 1) \cdot \left\lfloor \frac{N_{AV}}{\alpha} \right\rfloor \quad (4)$$

clock cycles and generates $$N_{SB} - (\alpha - 1) \cdot \left\lfloor \frac{N_{SB}}{\alpha} \right\rfloor \quad (5)$$

clock cycles.

Note that typically the values for $N_{AV}$, $N_{SB}$ and hence $\alpha$ are known a priori and are precalculated. If the state machine is implemented in hardware these values can be easily fixed in the hardware.

The state machine uses a first counter I to track the state number and a second counter cycle_count to count between 1 and $$\left\lfloor \frac{N_{AV}}{\alpha} \right\rfloor$$

when the state is in the range 1 to $\alpha$−1 and between 1 and $$N_{AV} - (\alpha - 1) \left\lfloor \frac{N_{AV}}{\alpha} \right\rfloor$$

when in the $\alpha$ state. The combination of I and cycle_count counters represent the current status of standby clock generation. At the moment the system switches from the fast clock to slow clock (i.e., high frequency to standby clock), the values of both counters are stored. This corresponds to time $T_1$, and the values are designated I' and cycle_count', and represent state' as shown in FIG. 3. Similarly, at the moment the system switches from the slow clock back to the fast clock, the values of both counters (designated I" and cycle_count" and represented as state") are stored. This corresponds to time $T_2$ as shown in FIG. 3.

Using these four values I', I", cycle_count' and cycle_count", the amount of jitter generated can be determined. This jitter error can be compensated for at the time of switching back to active mode by adjusting the fast clock counter (i.e., the bit counter).

Figure 7A:
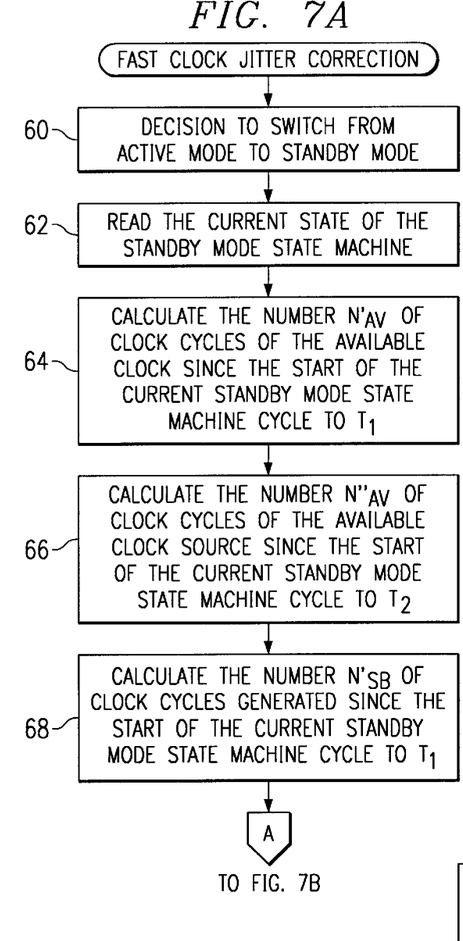
FIGS. 7A and 7B are a flow diagram illustrating the jitter correction method of the present invention.
Figure 7B:
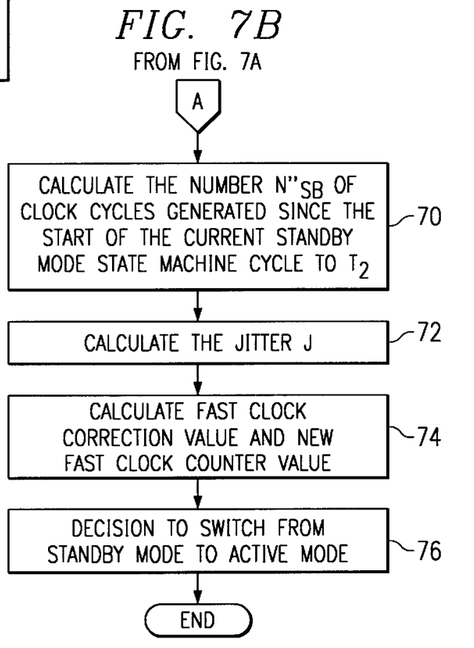

The jitter correction method performed in the jitter calculation processor 42 (FIG. 2) will now be described in more detail. A flow diagram illustrating the jitter correction method of the present invention is shown in FIGS. 7A and 7B. Assuming the communication system is currently in active mode, at some point in time it decides to switch from active mode to standby mode (step 60). This may be determined by an external entity, the communication protocol, the network, etc. To switch modes, the processor configures the select control input to the multiplexer 48 (FIG. 2) to select the standby clock. After the selection is performed, the jitter calculation processor 42 reads the current state' of the state machine (i.e., the current state number I' and number of clocks generated cycle_count' both corresponding to time $T_1$) (step 62).

The processor 42 then calculates the number of cycles of the available clock source that elapsed from the start of the current state machine cycle up to time $T_1$, (switching from active to standby mode) in accordance with Equation 6 below (step 64).

$$N'_{AV} = \text{cycle\_count}' + (I' - 1) \cdot \left\lfloor \frac{N_{AV}}{\alpha} \right\rfloor \quad (6)$$

The processor then calculates the number of cycles of the available clock source that elapsed from the start of the current state machine cycle up to time $T_2$ in accordance with Equation 7 below (switching from standby to active mode) (step 66).

$$N''_{AV} = (N'_{AV} + N_{FR} \times N_{CL}) \bmod N_{AV} \quad (7)$$

where $N_{FR}$ represents the number of frames counted while in standby mode and $N_{CL}$ represents the number of clock cycles in each frame.

The processor then calculates the number of clock cycles generated since the start of the current standby mode state machine cycle to time $T_1$ in accordance with Equation 8 below for value of I'=1 to $\alpha$−1 and Equation 9 for I'=$\alpha$ (step 68).

$$N'_{SB} = \left\lfloor \frac{N'_{AV}}{\left\lfloor \frac{N_{AV}}{\alpha} \right\rfloor} \right\rfloor \cdot \left\lfloor \frac{N_{SB}}{\alpha} \right\rfloor + \min\left(\left\lfloor \frac{N_{SB}}{\alpha} \right\rfloor, \quad (8)\right.$$

$$\left. N'_{AV} - \left\lfloor \frac{N'_{AV}}{\left\lfloor \frac{N_{AV}}{\alpha} \right\rfloor} \right\rfloor \cdot \left\lfloor \frac{N_{AV}}{\alpha} \right\rfloor \right) \text{ for } I' = 1 \text{ to } \alpha - 1$$

and $$N'_{SB} = (\alpha - 1) \cdot \left\lfloor \frac{N_{SB}}{\alpha} \right\rfloor + \min\left(N_{SB} - (\alpha - 1) \cdot \left\lfloor \frac{N_{SB}}{\alpha} \right\rfloor, \right. \quad (9)$$

$$\left. N'_{AV} - (\alpha - 1) \cdot \left\lfloor \frac{N_{SB}}{\alpha} \right\rfloor \right) \text{ for } I' = \alpha$$

The particular state (i.e., the value of I') and which equation to use can be determined by evaluating the following. If $$N'_{AV} < (\alpha - 1) \cdot \left\lfloor \frac{N_{AV}}{\alpha} \right\rfloor \quad (10)$$

then use Equation 8, otherwise use Equation 9.

The processor then calculates the number of clock cycles generated since the start of the current standby mode state machine cycle to time $T_2$ in accordance with Equation 11 below for value of 1''=1 to $\alpha$−1 and Equation 12 for I''=$\alpha$ (step 70).

$$N''_{SB} = \left(\left\lfloor \frac{N''_{AV}}{\left\lfloor \frac{N_{AV}}{\alpha} \right\rfloor} \right\rfloor\right) \cdot \left\lfloor \frac{N_{SB}}{\alpha} \right\rfloor + \quad (11)$$

$$\min\left(\left\lfloor \frac{N_{SB}}{\alpha} \right\rfloor, N''_{AV} - \left\lfloor \frac{N''_{AV}}{\left\lfloor \frac{N_{AV}}{\alpha} \right\rfloor} \right\rfloor \cdot \left\lfloor \frac{N_{AV}}{\alpha} \right\rfloor\right)$$

for $I'' = 1$ to $\alpha - 1$ and $$N''_{SB} = (\alpha - 1) \cdot \left\lfloor \frac{N_{SB}}{\alpha} \right\rfloor + \quad (12)$$

$$\min\left(N_{SB} - (\alpha - 1) \cdot \left\lfloor \frac{N_{SB}}{\alpha} \right\rfloor, N''_{AV} - (\alpha - 1) \cdot \left\lfloor \frac{N_{SB}}{\alpha} \right\rfloor\right)$$

for $I'' = \alpha$

The particular state (i.e., the value of I') and which equation to use can be determined by evaluating the following. If $$N''_{AV} < (\alpha - 1) \cdot \left\lfloor \frac{N_{AV}}{\alpha} \right\rfloor \quad (13)$$

then use Equation 11, otherwise use Equation 12.

The jitter J generated is calculated (step 72) for each state at $T_1$, and $T_2$ as follows. For state'

$$J' = \frac{N'_{AV}}{F_{AV}} - \frac{N'_{SB}}{F_{SB}} \text{ [sec]} \quad (14)$$

and for state''

$$J'' = \frac{N''_{AV}}{F_{AV}} - \frac{N''_{SB}}{F_{SB}} \text{ [sec]} \quad (15)$$

The total jitter J is the difference and is given by $$J = \frac{N'_{AV} - N''_{AV}}{F_{AV}} - \frac{N'_{SB} - N''_{SB}}{F_{SB}} \text{ [sec]} \quad (16)$$

maximum jitter obtainable is limited and is given by $$|\max(J)| = \frac{\left\lfloor \frac{F_{AV}}{\alpha} \right\rfloor}{\left\lfloor \frac{F_{SB}}{\alpha} \right\rfloor \cdot GCD \cdot F_{AV}} \text{ [sec]} \quad (17)$$

Once the jitter error is calculated, the fast clock correction value can be determined and the fast clock counter (i.e., the bit counter) can be modified with the new count value (step 74).

$$\text{new\_count\_value} = \text{round}\left[-\frac{J}{F_{FAST}}\right] + \text{current\_count\_value} \quad (18)$$

where $F_{FAST}$ represents the frequency of the fast clock and the current_count_value represents the value the fast counter would normally have been set to without the present invention. Often, the fast counter would be initialized to zero wherein the counter would be initialized with a negative number or the equivalent number modulo the maximum count value (i.e., the number of bits in a frame). Alternatively, the original counter value may be maintained but a portion of the bits of the current frame equal to the jitter error is discarded. Alternatively, the communication system may be caused to 'wake-up' earlier (or later) to account for the time represented by the jitter error in order not to lose any bits in a frame. The decision to switch back to the active state is then made and the new_count_value is loaded into the fast counter(step 76).

An illustrative example will now be presented. The difference in frequencies of the fast and the available clocks is on the order of approximately 10 to 1. Suppose the desired standby frequency is 3.2 KHz while the available clock is the common frequency 32.768 KHz used to keep time.

$F_{AV}$=32.768 KHz $F_{SB}$=3.2 Kz

The greatest integer common divider GCD is determined to be 128. The values of $N_{AV}$, $N_{SB}$ and $\alpha$ can be calculated using Equations 1, 2 and 3.

$N_{AV}$=256

$N_{SB}$=25

$\alpha$=10

Thus, during states 1 through $\alpha$−1 the state machine counts 25 cycles of the available clock and generates 2 clocks of the standby clock. During the last state $\alpha$ the state machine counts 31 cycles of the available clock and generates 7 clocks of the standby clock. Thus, the jitter accumulated during the state machine cycle is compensated for in the last state.

Assume that the state' of the state machine at time $T_1$, of switching from the active mode to the standby mode comprises I'=4 (current state #4) and cycle_count=18 cycles counted. The time interval the system is in standby mode is known beforehand: the number of frames $N_{FR}$=100 and the number of standby clock cycles in each frame $N_{CL}$=50.

Using these numbers, the values for $N'_{AV}$ and $N''_{AV}$ can be determined using Equations 6 and 7.

$N'_{AV}$=18+3×25=93

$N''_{AV}$=(93+100×50)mod 256=229

Since Equation 10 evaluates to TRUE, Equation 8 is used to calculate $N_{SB}'$. Similarly, Equation 13 evaluates to FALSE, thus Equation 12 is used to calculate $N''_{SB}$.

$$N'_{SB} = \left\lfloor \frac{93}{25} \right\rfloor \times 2 + \min\left(2, 93 - \left\lfloor \frac{93}{25} \right\rfloor \times 25\right)$$
$$= 6 + \min(2,18)$$
$$= 8$$

and $$N''_{SB} = 9 \times 2 + \min(25 - 9 \times 2, 229 - 9 \times 25)$$
$$= 18 + \min(7,4)$$
$$= 22$$

The jitter J is calculated in accordance with Equation 16 as shown below $$J = \frac{93 - 229}{32768} - \frac{8 - 22}{3200}$$
$$-4.15 \times 10^{-3} - (-4.38 \times 10^{-3})$$
$$= 225 \, \mu sec$$

Assuming a fast clock rate of 1 MHz, the new count value is given in accordance with Equation 18 as shown below $$\text{new\_count\_value} = round(-225) + 0$$
$$= -225$$

Thus, the counter is loaded with −225 or as an equivalent is loaded with 775 assuming 1000 bits (or fast clock cycles) per frame. The clock jitter can thus be compensated for by initializing the bit counter to 775.

It is intended that the appended claims cover all such features and advantages of the invention that fall within the spirit and scope of the present invention. As numerous modifications and changes will readily occur to those skilled in the art, it is intended that the invention not be limited to the limited number of embodiments described herein. Accordingly, it will be appreciated that all suitable variations, modifications and equivalents may be resorted to, falling within the spirit and scope of the present invention.

What is claimed is:

1. A method of generating a first clock signal having a desired first frequency from an available second clock signal having a second frequency wherein said second frequency is higher than said first frequency, said method comprising the steps of:

generating said first clock signal by sequencing through a predetermined number of states whereby during each state a first plurality of cycles of said second clock are absorbed and a second plurality of cycles of said second clock are output as cycles of said first clock;

correcting timing differences between said desired first frequency and said available second frequency at the end of each said sequence by adding a correcting time interval to said first clock such that the average frequency of said first clock is substantially equal to said desired first frequency; and calculating a compensation interval to compensate for the accumulated timing jitter of said first clock signal during a specified time interval.

2. The method according to claim 1, wherein said compensation interval is calculated during a time period ranging from the beginning of the current sequence to a specified point in time.

3. The method according to claim 1, wherein said step of correcting comprises the step of counting a specified number of cycles of said second clock signal so as to compensate for the difference between said first frequency and said second frequency.

4. The method according to claim 1, wherein said step of adding a correcting time interval comprises the step of absorbing a third plurality of cycles of said second clock signal and outputting a fourth plurality of clock cycles of said second clock.

5. The method according to claim 1, wherein said predetermined number of states, termed α, is determined by the ratio of said second frequency to said first frequency.

6. The method according to claim 1, wherein said predetermined number of states, termed α, is determined in accordance with the following $$\alpha = \left\lfloor \frac{N_{AV}}{N_{SB}} \right\rfloor = \left\lfloor \frac{F_{AV}}{F_{SB}} \right\rfloor$$

where $N_{AV}$ represents the total number of clock cycles of said second clock in one full sequence of states, $N_{SB}$ represents the total number of clock cycles of said first clock in one full sequence of states, $F_{AV}$ represents the value of said second frequency, and $F_{SB}$ represents the value of said first frequency.

7. The method according to claim 1, wherein for all states in said sequence other than the last, said first plurality of cycles is equal to $$\left\lfloor \frac{N_{AV}}{\alpha} \right\rfloor$$

where $N_{AV}=F_{AV}/GCD$, wherein GCD represents the greatest common divisor between said first frequency and said second frequency and a is the ratio of said second frequency to said first frequency.

8. The method according to claim 1, wherein for all states in said sequence other than, the last, said second plurality of cycles is equal to $$\left\lfloor \frac{N_{SB}}{\alpha} \right\rfloor$$

where $N_{SB}=F_{SB}/GCD$, wherein GCD represents the greatest common divisor between said first frequency and said second frequency and α is the ratio of said second frequency to said first frequency.

9. The method according to claim 1, wherein said step of generating comprises, for the last state in said sequence, absorbing cycles 1 through $$N_{AV} - (\alpha - 1) \cdot \left\lfloor \frac{N_{AV}}{\alpha} \right\rfloor$$

of said second clock, where $N_{AV}=F_{AV}/GCD$, wherein GCD represents the greatest common divisor between said first frequency and said second frequency and α is the ratio of said second frequency to said first frequency.

10. The method according to claim 1, wherein said step of generating comprises, for last state in said sequence, outputting $$N_{SB} - (\alpha - 1) \cdot \left\lfloor \frac{N_{SB}}{\alpha} \right\rfloor$$

cycles of said second clock, where $N_{SB}=F_{SB}/GCD$, wherein GCD represents the greatest common divisor between said first frequency and said second frequency and $\alpha$ is the ratio of said second frequency to said first frequency.

11. The method according to claim 3, further comprising the step of providing a third clock signal utilized during an active mode and having a third frequency higher than said first frequency and said second frequency, and adjusting a bit counter associated with said third clock signal in accordance with said compensation interval calculated.

12. The method according to claim 1, wherein said compensation interval comprises the total accumulated jitter as given by $$J = \frac{N'_{AV} - N''_{AV}}{F_{AV}} - \frac{N'_{SB} - N''_{SB}}{F_{SB}} \text{ (sec)}$$

where

J represents the total accumualted jitter, $F_{AV}$ represents the value of said second frequency, $F_{SB}$ represents the value of said first frequency.

$N'_{AV}$, $N''_{AV}$ represent the total number of clock cycles of said second clock accumulated from the beginning of a sequence to the beginning of said specified time interval, and to the end of said specified time interval, respectively, and $N'_{SB}$, $N''_{SB}$ represent the total number of clock cycles of said first clock generated from the beginning of a sequence to the beginning of said specified time interval, and to the end of said specified time interval, respectively.

13. A method of generating a first clock signal having a desired first frequency from a second clock signal having a second frequency, said method comprising the steps of:
counting a first predetermined number of cycles of said second clock signal on a periodic basis;
outputting a second predetermined number of cycles of said second clock signal on a periodic basis; and
correcting accumulated timing differences between said desired first frequency and said second frequency by counting a third predetermined number of cycles of said second clock signal and outputting a fourth predetermined number of cycles of said second clock signal such that the average frequency of said first clock is substantially equal to said desired first frequency.

14. The method according to claim 13, further comprising the step of calculating the timing jitter accumulated between a specified interval of time.

15. The method according to claim 14, further comprising the step of providing a third clock signal utilized during an active mode and having a third frequency higher than said first frequency and said second frequency, and adjusting a bit counter associated with said third clock signal in accordance with said calculated timing jitter.

16. The method according to claim 13, wherein said step of correcting comprises the step of counting a specified number of cycles of said second clock signal so as to compensate for the difference between said first frequency and said second frequency.

17. The method according to claim 13, wherein the periodicity of said steps of counting and outputting is divided into repeating sequences whereby each sequence is divided into $\alpha$ states, the value of $\alpha$ determined in accordance with the following $$\alpha = \left\lfloor \frac{N_{AV}}{N_{SB}} \right\rfloor = \left\lfloor \frac{F_{AV}}{F_{SB}} \right\rfloor$$

where $N_{AV}$ represents the total number of clock cycles of said second clock in one full sequence of states, $N_{SB}$ represents the total number of clock cycles of said first clock in one full sequence of states, $F_{AV}$ represents the value of said second frequency, and $F_{SB}$ represents the value of said first frequency.

18. The method according to claim 17, wherein for all states in said sequence other than the last, said first predetermined number of cycles is equal to $$\left\lfloor \frac{N_{AV}}{\alpha} \right\rfloor$$

where $N_{AV}=F_{AV}/GCD$, wherein GCD represents the greatest common divisor between said first frequency and said second frequency.

19. The method according to claim 17, wherein for all states in said sequence other than the last, said second predetermined number of cycles is equal to $$\left\lfloor \frac{N_{SB}}{\alpha} \right\rfloor$$

where $N_{SB}=F_{SB}/GCD$, wherein GCD represents the greatest common divisor between said first frequency and said second frequency.

20. The method according to claim 17, wherein said third predetermined number of cycles is equal to $$N_{AV} - (\alpha - 1) \cdot \left\lfloor \frac{N_{AV}}{\alpha} \right\rfloor$$

where $N_{AV}=F_{AV}/GCD$, wherein GCD represents the greatest common divisor between said first frequency and said second frequency.

21. The method according to claim 17, wherein said fourth predetermined number of cycles is equal to $$N_{SB} - (\alpha - 1) \cdot \left\lfloor \frac{N_{SB}}{\alpha} \right\rfloor,$$

where $N_{SB}=F_{SB}/GCD$, wherein GCD represents the greatest common divisor between said first frequency and said second frequency.

22. The method according to claim 13, wherein said compensation interval comprises the total accumulated jitter as given by $$J = \frac{N'_{AV} - N''_{AV}}{F_{AV}} - \frac{N'_{SB} - N''_{SB}}{F_{SB}} \text{ (sec)}$$

where

J represents the total accumualted jitter, $F_{AV}$ represents the value of said second frequency, $F_{SB}$ represents the value of said first frequency.

$N'_{AV}$, $N''_{AV}$ represent the total number of clock cycles of said second clock accumulated from the beginning of a sequence to the beginning of said specified time interval, and to the end of said specified time interval, respectively, and $N'_{SB}$, $N''_{SB}$ represent the total number of clock cycles of said first clock generated from the beginning of a sequence to the beginning of said specified time interval, and to the end of said specified time interval, respectively.

23. In a device having an active and a standby mode of operation, a method of accurately timing the period of time said device is in said standby mode, wherein said device utilizes a standby clock having a desired first frequency generated from an available clock having a second frequency while in standby mode and utilizes a fast clock having a third frequency while in said active mode, said method comprising the steps of:

dividing the output of said available clock into continuously repeating sequence of states;

for all states but the last in said sequence:
counting a first predetermined number of cycles of said available clock signal;
outputting as said standby clock a second predetermined number of cycles of said available clock signal;

for the last state in said sequence:
correcting timing differences accumulated during the current sequence between said desired first frequency and said second frequency by counting a third predetermined number of cycles of said available clock signal and outputting as said standby clock a fourth predetermined number of cycles of said available clock signal such that the average frequency of said standby clock is substantially equal to said desired first frequency; and calculating a compensation interval to compensate for the timing error of said standby clock signal accumulated while said device is in standby mode, said compensation interval derived from a jitter value determined in accordance with the total number of cycles of said available clock counted and the total number of cycles of said available clock generated during the current sequence up to the point in time said device switches to active mode.

24. The method according to claim 23, further comprising the step of providing a bit counter associated with said fast clock, and adjusting said bit counter in accordance with said compensation interval calculated from said jitter value.

25. The method according to claim 23, wherein said sequence comprises a states, whereby the value of $\alpha$ is determined by the ratio of said second frequency to said first frequency.

26. The method according to claim 23, wherein said sequence comprises a states, whereby the value of a is determined in accordance with the following $$\alpha = \left\lfloor \frac{N_{AV}}{N_{SB}} \right\rfloor = \left\lfloor \frac{F_{AV}}{F_{SB}} \right\rfloor$$

where
$N_{AV}$ represents the total number of clock cycles of said available clock in one full sequence of states,
$N_{SB}$ represents the total number of clock cycles of said standby clock in one full sequence of states,
$F_{AV}$ represents the value of said second frequency, and
$F_{SB}$ represents the value of said first frequency.

27. The method according to claim 23, wherein said first predetermined number is equal to $$\left\lfloor \frac{N_{AV}}{\alpha} \right\rfloor \text{ cycles,}$$

where $N_{AV}=F_{AV}/GCD$, wherein GCD represents the greatest common divisor between said first frequency and said second frequency and a is the rounded ratio of said second frequency to said first frequency.

28. The method according to claim 23, wherein said second predetermined number is equal to $$\left\lfloor \frac{N_{SB}}{\alpha} \right\rfloor \text{ cycles,}$$

where $N_{SB}=F_{SB}/GCD$, wherein GCD represents the greatest common divisor between said first frequency and said second frequency and $\alpha$ is the rounded ratio of said second frequency to said first frequency.

29. The method according to claim 23, wherein said third predetermined number is equal to $$N_{AV} - (\alpha - 1) \cdot \left\lfloor \frac{N_{AV}}{\alpha} \right\rfloor \text{ cycles,}$$

where $N_{AV}=F_{AV}/GCD$, wherein GCD represents the greatest common divisor between said first frequency and said second frequency and $\alpha$ is the ratio of said second frequency to said first frequency.

30. The method according to claim 23, wherein said fourth predetermined number is equal to $$N_{SB} - (\alpha - 1) \cdot \left\lfloor \frac{N_{SB}}{\alpha} \right\rfloor \text{ cycles,}$$

where $N_{SB}=F_{SB}/GCD$, wherein GCD represents the greatest common divisor between said first frequency and said second frequency and $\alpha$ is the ratio of said second frequency to said first frequency.

31. The method according to claim 23, wherein said compensation interval comprises the total accumualted jitter as given by $$J = \frac{N'_{AV} - N''_{AV}}{F_{AV}} - \frac{N'_{SB} - N''_{SB}}{F_{SB}} \text{ (sec)}$$

where
J represents the total accumualted jitter,
$F_{AV}$ represents the value of said second frequency,
$F_{SB}$ represents the value of said first frequency.
$N'_{AV}$, $N''_{AV}$ represent the total number of clock cycles of said available clock accumulated from the beginning of a sequence to the beginning of said specified time interval, and to the end of said specified time interval, respectively, and $N'_{SB}$, $N''_{SB}$ represent the total number of clock cycles of said standby clock generated from the beginning of a sequence to the beginning of said specified time interval, and to the end of said specified time interval, respectively.

32. An apparatus for generating a standby clock frequency in a device having an active and a standby mode of operation, wherein said device utilizes said standby clock having a desired first frequency while in standby mode and utilizes a fast clock having a second frequency while in said active mode, comprising:

means for generating said standby clock from an available clock source comprising:

means for absorbing a first plurality of cycles of said available clock;

means for outputting as said standby clock a second plurality of cycles of said available clock;

adjustment means for periodically adjusting for the accumulated timing error caused by the differences in frequencies of said standby clock and said available clock such that the average frequency of said standby clock is substantially equal to said desired first frequency; and     means for calculating a compensation interval to compensate for the timing error of said standby clock signal accumulated during the time said device was in standby mode, said compensation interval derived from a jitter value determined in accordance with the total number of cycles of said available clock counted and the total number of cycles of said available clock generated during the current sequence up to the point in time said device switches to active mode.

33. An apparatus for generating a standby clock frequency in a device having an active and a standby mode of operation, wherein said device utilizes said standby clock having a desired first frequency while in standby mode and utilizes a fast clock having a second frequency while in said active mode, comprising:

a clock frequency generator adapted to generate said standby clock from an available clock source, said clock frequency generator comprising:

a standby mode state machine operative to:

absorb a first plurality of cycles of said available clock;

output as said standby clock a second plurality of cycles of said available clock;

periodically adjust for the accumulated timing error caused by the differences in frequencies of said standby clock and said available clock such that the average frequency of said standby clock is substantially equal to said desired first frequency; and     a jitter calculator adapted to calculate a compensation interval to compensate for the timing error of said standby clock signal accumulated during the time said device was in standby mode, said compensation interval derived from a jitter value determined in accordance with the total number of cycles of said available clock counted and the total number of cycles of said available clock generated during the current sequence up to the point in time said device switches to active mode.

\* \* \* \* \*